(12) United States Patent
Kitagawa et al.

(10) Patent No.: US 7,632,758 B2
(45) Date of Patent: Dec. 15, 2009

(54) PROCESS AND APPARATUS FOR FORMING OXIDE FILM, AND ELECTRONIC DEVICE MATERIAL

(75) Inventors: Junichi Kitagawa, Amagasaki (JP); Shinji Ide, Amagasaki (JP); Shigenori Ozaki, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 129 days.

(21) Appl. No.: 11/508,871

(22) Filed: Aug. 24, 2006

(65) Prior Publication Data

US 2007/0128880 A1    Jun. 7, 2007

Related U.S. Application Data

(63) Continuation of application No. 10/849,883, filed on May 21, 2004, now abandoned.

(30) Foreign Application Priority Data

May 23, 2003  (JP) ............... 2003-146228

(51) Int. Cl.
*H01L 21/31* (2006.01)
(52) U.S. Cl. ..................... 438/758; 438/778
(58) Field of Classification Search ............. 438/758, 438/778
See application file for complete search history.

(56) References Cited

U.S. PATENT DOCUMENTS

| 6,358,867 | B1 | 3/2002 | Tews et al. |
| 6,399,520 | B1* | 6/2002 | Kawakami et al. ......... 438/778 |
| 2002/0014666 | A1 | 2/2002 | Ohmi et al. |

FOREIGN PATENT DOCUMENTS

| JP | 2001-160555 A | 6/2001 |
| JP | 2002-246386 A | 8/2002 |

OTHER PUBLICATIONS

Japanese Office Action mailed on Aug. 12, 2008 in Japanese Application No. 2003-146228.

* cited by examiner

*Primary Examiner*—Douglas M Menz
(74) *Attorney, Agent, or Firm*—Finnegan, Henderson, Farabow, Garrett & Dunner, L.L.P.

(57) ABSTRACT

An oxide film-forming apparatus, comprising: a process chamber for disposing an electronic device substrate at a predetermined position; water vapor supply means for supplying water vapor into the process chamber; and plasma exciting means for activating the water vapor with plasma, whereby the surface of the electronic device substrate can be irradiated with the plasma based on the water vapor.

7 Claims, 14 Drawing Sheets

(LOCOS)

(Sharrow Trench Isoration)

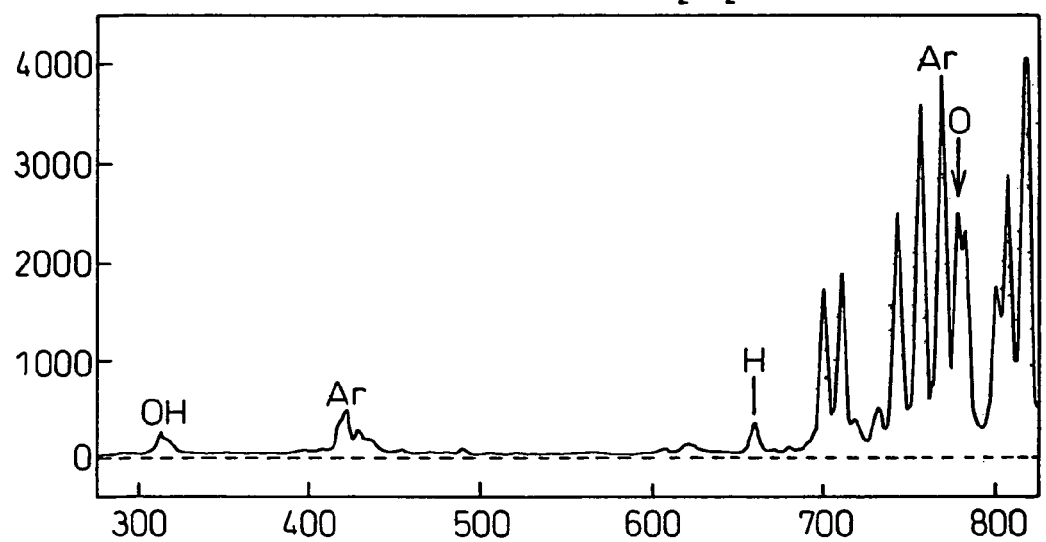
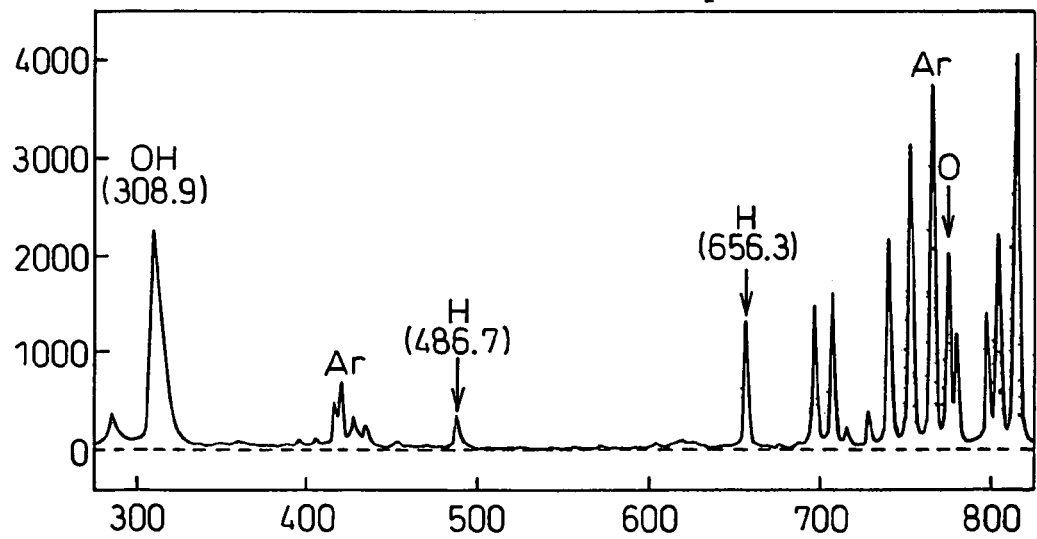

(1.0.0) THIN
(1.1.0) THICK
CONVENTIONAL THERMAL OXIDATION

PROCESS AND APPARATUS FOR FORMING OXIDE FILM, AND ELECTRONIC DEVICE MATERIAL

This is a continuation of Application No. 10/849,883, filed May 21, 2004 now abandoned. Additionally, Applicants claim the right of priority under 35 U.S.C. § 119(a)-(d) based on Application No. 2003-146228, filed on May 23, 2003, in the Japanese Patent Office, the contents of which are incorporated herein by reference.

BACKGROUND OF THE INVENTION

1. Field of the Invention

The present invention relates to a process for forming an oxide film which is capable of suitably forming an oxide film, as one of fundamental techniques constituting the electronic device fabrication process, an apparatus for forming an oxide film which can preferably be used in such an oxide film-forming process, and an electronic device material which can preferably be formed by using the oxide film-forming process and apparatus. The process for forming an oxide film according to the present invention can preferably be used for forming materials for semiconductors or semiconductor devices (such as those having an MOS type semiconductor structure, and those having a thin film transistor (TFT) structure) or liquid crystal devices.

2. Related Background Art

Along with an increase in the degree or scale of integration of semiconductor devices in recent years, the element isolation technique tends to be shifted from LOCOS (Local Oxidation of Silicon; isolation by a field oxide film) to STI (shallow trench isolation; isolation by a trench groove). This is because the STI technique may easily provide an advantage that deeper and more reliable isolation can be attained.

When the STI is used, a highly reliable oxide film is first formed as a base oxide film on the surface of a trench groove, and then the trench groove is filled with an oxide film by using chemical vapor deposition (CVD), etc. Heretofore, in this case, the base oxide film has been formed by using a thermal oxidation process.

In the above thermal oxidation process, a high temperature of about 1000° C. is required. Accordingly, the above STI (trench oxidation) is only applicable to a very early step among the entire device fabrication process wherein the thermal damage due to the thermal oxidation is negligible.

When the above STI is adopted, the structure obtained therefrom naturally becomes a three-dimensional structure. In such a three-dimensional structure, it is necessary to oxidize surfaces of an Si substrate (or base material) having different crystal orientations. However, in the thermal oxidation process, the growth rate is dependent on the crystal orientation, and therefore the thickness of the resultant oxide film has a strong tendency such that it varies with different crystal orientations of the Si substrate in the trench groove having a film which has been obtained by the thermal oxidation process. Accordingly, when a minimum film thickness is intended to be secured, there are produced crystal orientation surfaces which have been oxidized undesirably thickly, and such a phenomenon has hindered the fabrication of finer devices.

Further, in order to enhance the reliability of oxide films, also in the thermal oxidation process, a wet oxidation process utilizing ($H_2O$) or ($H_2O_2$) is used, and the development of an oxidation temperature technique capable of decreasing the rate is in progress. However, the thermal oxidation process still requires a temperatures of about 800° C. or higher. In order to secure the element isolation, the substrate is usually doped so as to provide a predetermined profile of an impurity. In this case, however, this technique tends to cause a problem such that the impurity is again dispersed in the processing due to the thermal oxidation process at 800° C. or higher.

SUMMARY OF THE INVENTION

An object of the present invention is to provide a process and apparatus for forming an oxide film which have solved the above-mentioned problem encountered in the prior art, and an electronic device material having a high-quality oxide film.

Another object of the present invention is to provide a process and apparatus for forming an oxide film which can control the film thickness of an oxide film, and can provide a high-quality oxide film, and an electronic device material having such a high-quality oxide film.

A further object of the present invention is to provide a process and apparatus for forming an oxide film which can suppress the thermal damage to an object to be processed, to a level as slight as possible, and an electronic device material having such a high-quality oxide film.

As a result of earnest study, the present inventors have found that the above object may be attained extremely effectively, by irradiating an object to be processed with plasma in the presence of a process gas containing at least water vapor.

The process for forming an oxide film according to the present invention is based on the above discovery, and comprises: irradiating the surface of an electronic device substrate with plasma in the presence of a process gas containing at least water vapor, so as to form an oxide film on the surface of the electronic device substrate.

The present invention also provides an oxide film-forming apparatus, comprising:

a process chamber for disposing an electronic device substrate at a predetermined position;

water vapor supply means for supplying water vapor into the process chamber; and plasma exciting means for activating the water vapor with plasma, whereby the surface of the electronic device substrate can be irradiated with the plasma based on the water vapor.

The present invention further provides an electronic device material, comprising:

an electronic device substrate having at least one trench groove, and an oxide film covering a part of the surface of the electronic device substrate; the part containing at least one trench groove, wherein, in the oxide film covering the trench groove, the ratio ($T_{100}/T_{110}$) of the thickness $T_{100}$ of the oxide film disposed on the surface (100) of the electronic device material, to the thickness $T_{110}$ of the oxide film disposed on the surface (110) of the electronic device material is 0.65 or larger.

In the formation of the oxide film according to the present invention having the above constitution, plasma irradiation is conducted in the presence of a process gas containing at least water vapor (as desired, further comprising $O_2$ and/or ($O_2$+ $H_2$)). According to the present inventors, knowledge and investigations, it has been confirmed from the spectroscopic analysis of plasma emission that, when $H_2O$ is produced prior to the introduction thereof into a processing chamber containing therein an object to be processed, a larger number of OH groups are produced (as shown in the graph of FIG. 20 appearing hereinafter). Based on the presence of such a large number of OH groups, it is presumed that the present invention can form a highly reliable oxide film, even at a low temperature, e.g., 500° C. or lower.

Further, unlike the conventional oxidation process using thermal reaction, the present invention provides a process wherein silicon is oxidized by the supply of oxidizing species, which have been activated by plasma and such a process is not dependent on the thermal reaction or thermal diffusion. Accordingly, in the present invention, it is possible to realize the oxidization which is relatively less dependent on the surface orientation of a substrate for an electronic device, and as a result, it is easy to form an oxide film having a uniform film thickness, even on the surface of the substrate having a three-dimensional structure (e.g., a trench groove).

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 20 is a graph showing an example of the analytical result of plasma emission in the present invention.

Figure 1:
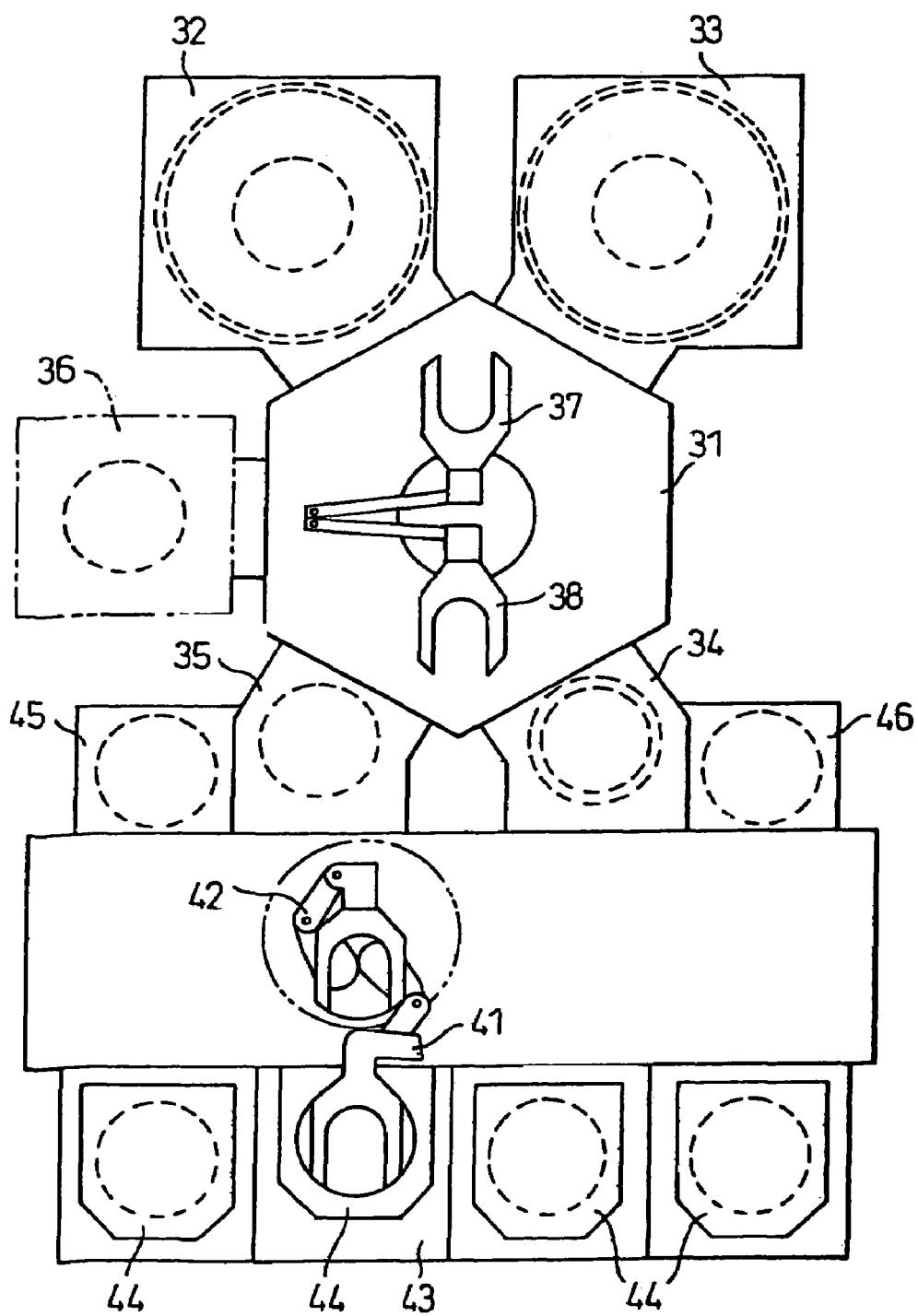
FIG. 1 is a schematic plan view showing an example of a semiconductor manufacturing equipment for conducting the oxide film-forming process according to the present invention.

In the accompanying drawings, the respective reference numerals have the following meanings.

W: wafer (substrate to be processed)
60: plane antenna member (planar antenna member)
2: oxide film
2a: nitrogen-containing layer
32: plasma processing unit (process chamber)
33: plasma processing unit (process chamber)
47: heating reactor

DETAILED DESCRIPTION OF PREFERRED EMBODIMENTS

Hereinbelow, the present invention will be described in detail with reference to the accompanying drawings, as desired. In the following description, "%", and "apart(s)" representing a quantitative proportion or ratio are those based on mass, unless otherwise noted specifically.

(Oxide Film-Forming Process)

In the present invention, the surface of a substrate for an electronic device is irradiated with plasma in the presence of a process gas containing at least water vapor, to thereby form an oxide film on the surface of the electronic device substrate.

(Electronic Device Substrate)

The electronic device substrate usable in the present invention is not particularly limited, and may be one appropriately selected from known electronic device substrates, or a combination of two or more of these substrates. Examples of such electronic device substrates may include: e.g., semiconductor materials and liquid crystal device materials. Examples of semiconductor materials may include, e.g., materials mainly comprising monocrystalline silicon, materials mainly comprising polycrystalline silicon, and materials mainly comprising silicon nitride.

(Oxide Film)

In the present invention, the oxide film to be disposed on the electronic device substrate is not particularly limited, as long as it can be formed by the oxidation of the electronic device substrate. Such an oxide film may be an oxide film or a combination of two or more known oxide films to be used for known electronic devices.

(Process Gas)

In the present invention, at the time of forming an oxide film, the process gas to be used therefor contains at least water vapor. Another gas (e.g., an inert gas or a rare gas) may be used in combination therewith, as desired. The rare gas to be used in such a case is not particularly limited, but may be one appropriately selected from known rare gases, or a combination of two or more species thereof. In view of the productivity, it is preferred to use argon, helium, neon, or krypton as a rare gas.

(Water Vapor)

In the present invention, the property or state, production process and so forth of water vapor are not particularly limited, as long as it is water vapor which can form an oxide film on an electronic device substrate in combination with microwave plasma.

The water or water vapor (usually, at a pure water level) which is preferably usable in the present invention, may include, e.g., those obtained by the following processes.

(1) A process using a water vapor generator (WVG)

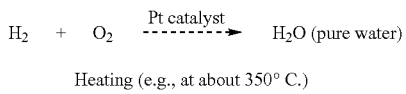

Heating (e.g., at about 350° C.)

(2) A process using a pyrogenic reaction.

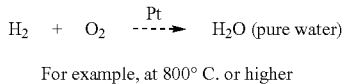

For example, at 800° C. or higher (3) A process using bubbling to obtain water vapor for pure water.

(Oxide Film Formation Conditions)

In an embodiment wherein the present invention is used for forming an oxide film, the following conditions may preferably be used, in view of the characteristics of the oxide film to be formed.

(1) $H_2O$: 1-10 sccm, more preferably 5 sccm (about 0.2-2 volume %, more preferably about 1 volume % with respect to a rare gas), (2) Rare gas (e.g., Kr, Ar or He): 250-1000 sccm, particularly preferably 500 sccm (3) Temperature: room temperature (25° C.)–500° C., particularly preferably 400° C.

(4) Pressure: 6.67-266 Pa (50-2000 mTorr), particularly preferably 133 Pa (1000 mTorr)

(5) Microwave: 2.4-4.9 $W/cm^2$, more preferably 4.3 $W/cm^2$.

In general, in many cases, an impurity is diffused into a semiconductor substrate in advance to form an active region or element an isolation region so as to form a device element on the semiconductor substrate. However, in the conventional thermal oxidation process, a region containing an impurity can be destroyed due to the high temperature during the processing time as described above, to thereby cause a problem.

In contrast, the present invention permits a low-temperature processing, and therefore the present invention not only can protect the impurity region, but also can suppress the damage, distortion and so forth due to heat. Further, it is also possible that an oxide film is formed according to the present invention, and then a desired film (e.g., CVD film) is formed at a relatively low temperature (about 500° C.), and thereafter, the oxide film-forming process according to the present invention may preferably be used in the later oxidation step, whereby the process control becomes easier.

(Electronic Device Material Having Oxide Film)

The present invention may preferably provide an electronic device material, which has at least one trench groove and has an oxide film covering at least a portion of the surface of the electronic device material containing the trench groove. Herein, the "trench groove" refers to a groove which has been formed in the electronic device material. The trench groove is present on the surface of the electronic device substrate at the time of the formation of the oxide film, but after the formation of the oxide film, another layer or another structure, etc., may be formed on the trench groove.

In the above electronic device material, the ratio ($T_{100}/T_{110}$) of the thickness $T_{100}$ of an oxide film formed on the surface (100) to the thickness $T_{110}$ of an oxide film formed on the surface (110) may preferably be close to one (1) in the oxide film covering the trench groove.

(Apparatus for Forming an Oxide Film)

The oxide film-forming apparatus according to the present invention comprises: a process chamber for disposing an electronic device substrate at a predetermined position; water vapor supply means for supplying water vapor into the process chamber; and plasma exciting means for exciting the water vapor by plasma; whereby the surface of the electronic device substrate can be irradiated with the plasma based on the water vapor. In the present invention, the plasma exciting means is not particularly limited, but may preferably be stand-alone (electric field-free) type plasma exciting means, such as plasma exciting means utilizing microwave irradiation, in view of plasma damage. Further, in view of uniform oxide film formation, the plasma exciting means may particularly preferably be plasma exciting means which supplies microwave through a plane antenna member, among those of the stand-alone plasma type.

(Plane Antenna Member)

In the present invention, it is preferred that a high-density plasma having a low electron temperature is generated by irradiating microwave via a plane antenna member having a plurality of slits; and an oxide film is formed on the surface of a substrate to be processed by utilizing the thus generated plasma. Such an embodiment can provide a process which accomplishes a light plasma damage, and a high reactivity at a low temperature.

For example, a paper (Ultra Clean Technology, Vol. 10 Supplement 1, p. 32, 1998, published by Ultra Clean Society) may be referred to, with respect to the details of microwave plasma apparatus which has such a plane antenna having many slits and is capable of generating plasma having a low electron temperature, providing a light plasma damage, and a high plasma density.

When the above new plasma apparatus is used, it can easily provide a plasma having an electron temperature of 1.5 eV or less, and plasma sheath voltage of several volts or less. Accordingly, in this case, the plasma damage can remarkably be reduced, as compared with that based on the conventional plasma (plasma sheath voltage of about 50V). A new plasma apparatus comprising this plane antenna is capable of providing high-density radicals even at a temperature of about 300° C. to about 700° C., it is considered that it can suppress the deterioration of device characteristics due to heating, and it can provide a process having a high reactivity even at a low temperature.

(Preferred Plasma)

The characteristics of plasma to be preferably used in the present invention are as follows:

(1) Electron temperature. 1.0 eV or lower
(2) Density: $1 \times 10^{12}$ (1/cm$^3$) or greater
(3) Uniformity in plasma density: +/−5% or smaller at directly beneath the plane antenna.

As described above, the process for the present invention can form a high-quality oxide film which enables easy control of the film thickness (whether the film is either thin a film or a thick film). Accordingly, when another layer (e.g., an electrode layer) is formed on the thus formed oxide film, it is possible to form a semiconductor device structure having an excellent characteristic.

The process according to the present invention can form an oxide film having a high reliability and having a film thickness of about 10 nm. Accordingly, the present invention is applicable to a gate oxide film for an MOS type semiconductor, in addition to the base oxidation for an element isolation trench groove.

One Embodiment of Production Process

Next, there is described an embodiment of the oxide film-forming process according to the present invention.

FIG. 1 is a schematic view (schematic plan view) showing an example of the total arrangement of a semiconductor manufacturing equipment 30 for conducting the oxide film-forming process according to the present invention.

Figure 3:
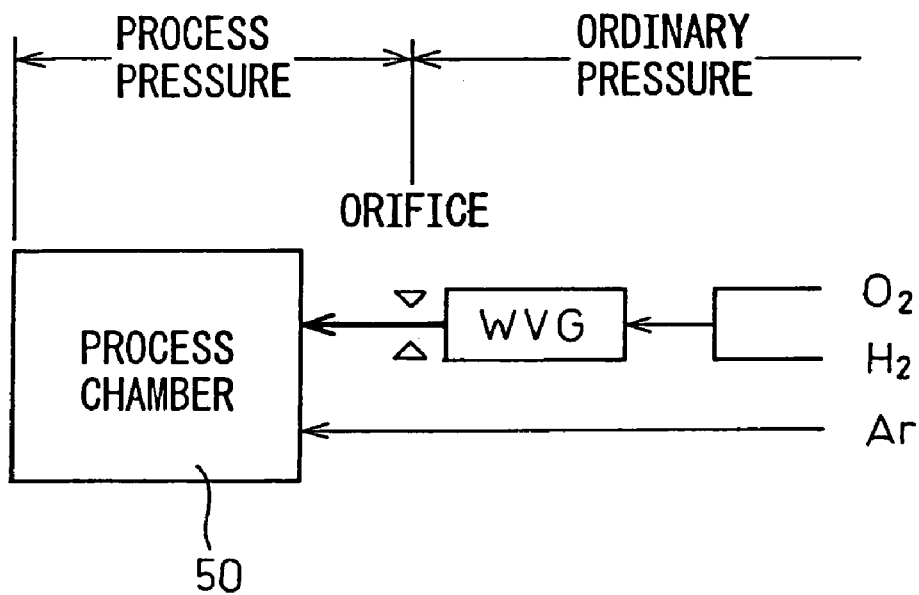
FIG. 3 is a block diagram showing an example of the water vapor generator (WVG) for the oxide film-forming process according to the present invention.

As shown in FIG. 1, in a substantially central portion of the semiconductor manufacturing equipment 30, there is disposed a transportation chamber 31 for transporting a wafer W (FIG. 3). Around the transportation chamber 31, there are disposed: plasma processing units 32 and 33 for conducting various treatments on the wafer, two load lock units 34 and 35 for conducting the communication/cutoff between the respective processing chambers, a heating unit 36 for operating various heating treatments, and a heating reaction furnace 47 for conducting various heating treatments on the wafer. These units are disposed so as to surround the transportation chamber 31. Alternatively, it is also possible to provide the heating reaction furnace 47 independently and separately from the semiconductor manufacturing equipment 30.

On the side of the load lock units 34 and 35, a preliminary cooling unit 45 and a cooling unit 46 for conducting various kinds of preliminary cooling and cooling treatments are disposed.

In the inside of transportation chamber 31, transportation arms 37 and 38 are disposed, so as to transport the wafer W (FIG. 3) between the above-mentioned respective units 32-36.

On the foreground side of the load lock units 34 and 35 in this figure, loader arms 41 and 42 are disposed. These loader arms 41 and 42 can put wafer W in and out with respect to four cassettes 44 which are set on the cassette stage 43, which is disposed on the foreground side of the loader arms 41 and 42.

In FIG. 1, as the plasma processing units 32 and 33, two plasma processing units of the same type are disposed in parallel.

Further, it is possible to exchange both of the plasma processing units 32 and 33 with a single-chamber type CVD process unit. It is possible to set one or two of such a single-chamber type CVD process unit in the position of plasma processing units 32 and 33.

When two plasma processing units 32 and 33 are used, it is possible that an SiO$_2$ film is formed in the plasma processing unit 32, and the SiO$_2$ film is surface-nitrided in the plasma processing unit 33. Alternatively, it is also possible that the formation of an SiO$_2$ film and the surface-nitriding of the SiO$_2$ film are conducted in parallel, in the plasma processing units 32 and 33. Further, it is also possible that an SiO$_2$ film is formed in another apparatus, and the SiO$_2$ film is surface-nitrided in parallel, in the plasma processing units 32 and 33.

One Embodiment of Film Formation of Gate Insulator

Figure 2:
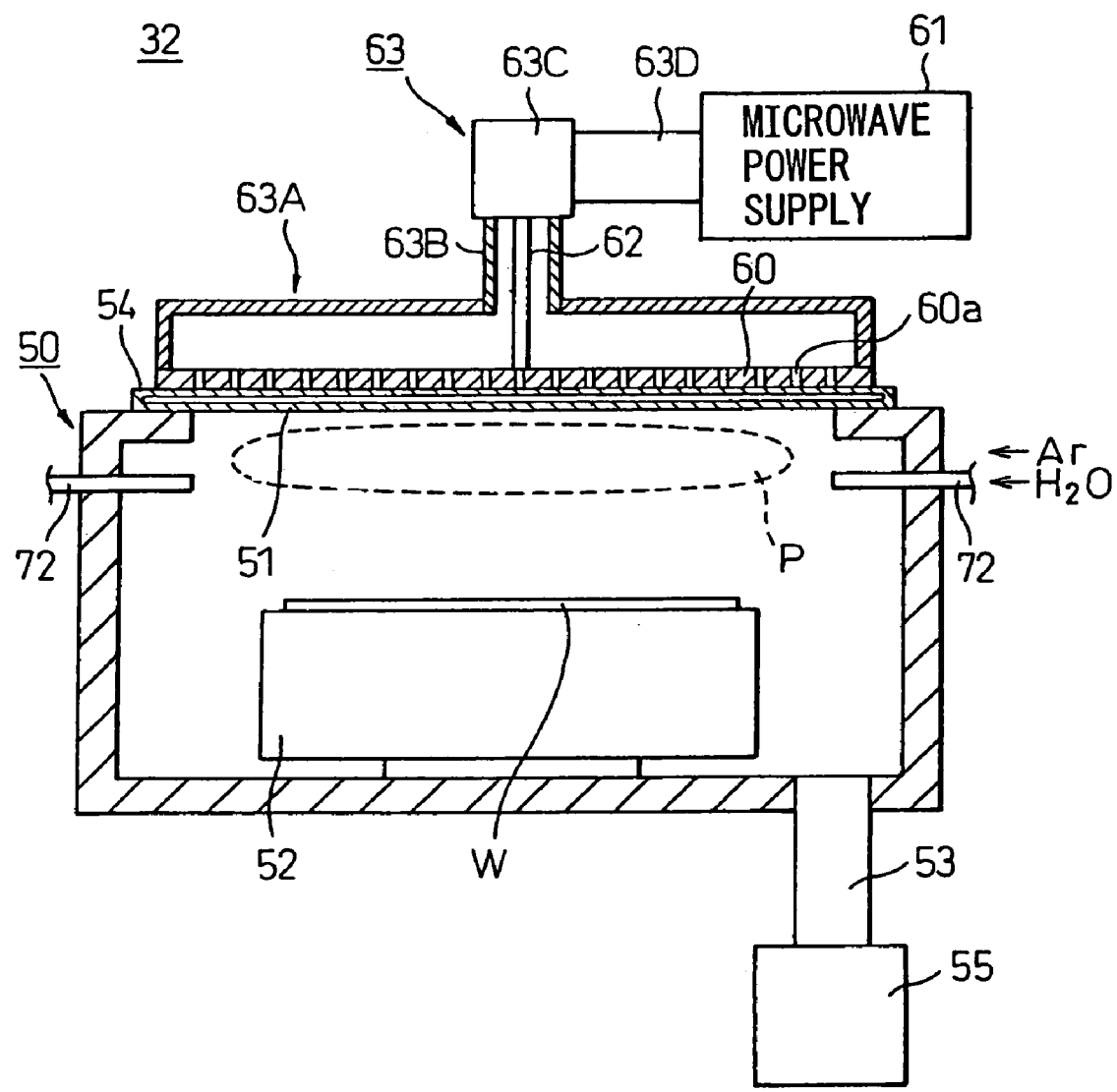
FIG. 2 is a schematic vertical sectional view showing an example of the slot plain antenna (plane antenna member) plasma processing unit which is usable in the oxide film-forming process according to the present invention.

FIG. 2 is a schematic sectional view in the vertical direction showing a plasma processing unit 32 (or 33) which is usable in the oxide film formation. FIG. 3 is a block diagram showing an example of the water vapor generating means which is preferably usable in the apparatus shown in FIG. 2.

Referring to FIG. 2, reference numeral 50 denotes a vacuum container made of, e.g., aluminum. In the upper portion of the vacuum container 50, an opening portion 51 is formed so that the opening portion 51 is larger than a substrate (for example, wafer W). A top plate 54 in a flat cylindrical shape made of a dielectric such as quartz and aluminum nitride so as to cover the opening portion 51. In the side wall of the upper portion of vacuum container 50 which is below the top plate 54, gas feed pipes 72 are disposed in the 16 positions, which are arranged along the circumferential direction so as to provide equal intervals therebetween. A process gas comprising at least water vapor H$_2$O (as desired, further comprising an inert such as rare gas) can be supplied into the plasma region P in the vacuum container 50 from the gas feed pipes 72 evenly and uniformly.

Referring to FIG. 3, oxygen gas and hydrogen gas can be supplied to one side of the water vapor generator (WVG), as an embodiment of the water vapor supply means to be preferably be usable in the present invention. The other side of the WVG is connected to the process chamber 50 through an orifice, so that water vapor can be supplied to the process chamber 50.

When such a moisture generator is used, an object to be processed can be oxidized according to the following reaction.

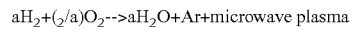

$aH_2 + (_2/a)O_2 \rightarrow aH_2O + Ar + microwave\ plasma$

Figure 4:
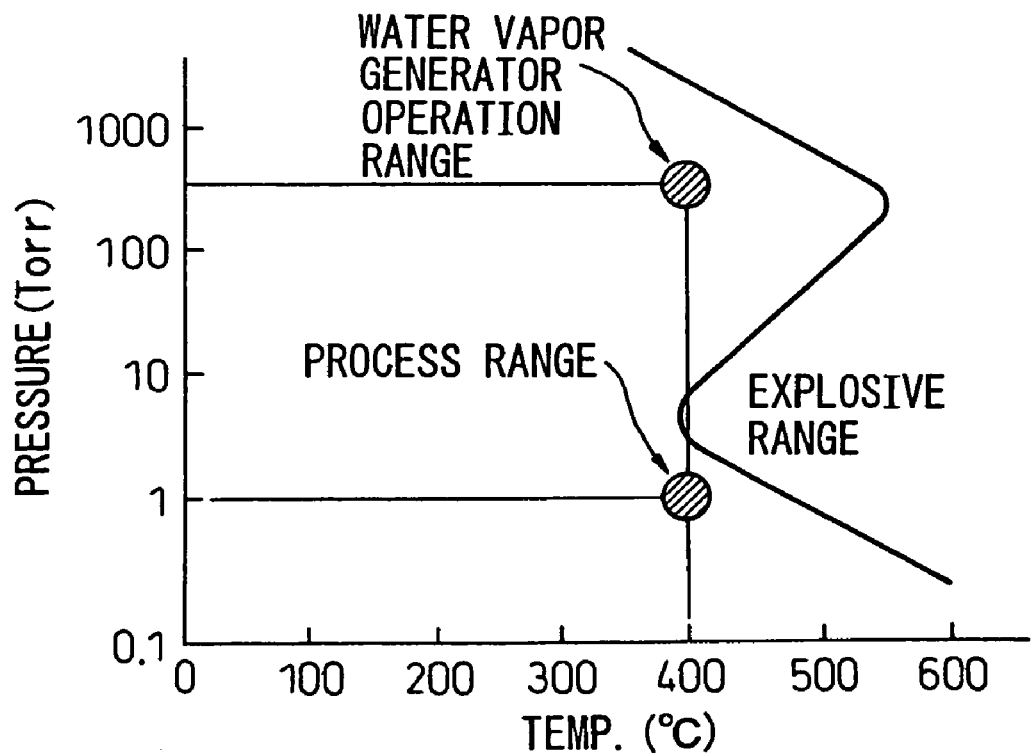
FIG. 4 is a graph showing the explosion range of a mixed gas of oxygen and hydrogen, the operation range for a moisture generator, and a process range.

It is generally known in the combustion reaction of H$_2$ and O$_2$ that a pressure-temperature characteristic as shown in FIG. 4 is present. In order to satisfy each of the conditions for the safe processing, the moisture generator, and oxidation treatment, the moisture generator may preferably be operated at about atmospheric pressure, and the oxidation treatment may preferably be carried out at about 133 Pa, and therefore a pressure difference should be provided between the process chamber and the moisture generator by using an orifice.

On the outside of the top plate 54, there is provided a radio-frequency power source, via a slit plane member antenna 60 having a plurality of slits, which comprises a slot plane antenna (SPA) made from a copper plate, for example. As the radio-frequency power source, a waveguide 63 is disposed on the top plate 54, and the waveguide 63 is connected to a microwave power supply 61 for generating microwave of 2.45 GHz, for example. The waveguide 63 comprises a combination of: a flat circular waveguide 63A, of which lower end is connected to the plane antenna member 60; a circular waveguide 63B, one end of which is connected to the upper surface side of the circular waveguide 63A; a coaxial waveguide converter 63C connected to the upper surface side of the circular waveguide 63B; and a rectangular waveguide 63D, one end of which is connected to the side surface of the coaxial waveguide converter 63C so as to provide a right angle therebetween, and the other end of which is connected to the microwave power supply 61.

In the present invention, a frequency region including UHF and microwave is referred to as radio-frequency (or high-frequency) region. The radio-frequency power supplied from the radio-frequency power source may preferably have a frequency of not smaller than 300 MHz and not larger than 2500 MHz, which may include UHF having a frequency of not smaller than 300 MHz and microwave having a frequency of not smaller than 1 GHz. In the present invention, the plasma generated by the radio-frequency power is referred to as "radio-frequency plasma".

In the inside of the above-mentioned circular waveguide 63B, an axial portion 62 of an electroconductive material is coaxially provided, so that one end of the axial portion 62 is connected to the central (or nearly central) portion of the plane antenna member 60 upper surface, and the other end of the axial portion 62 is connected to the upper surface of the circular waveguide 63B, whereby the circular waveguide 63B constitutes a coaxial structure. As a result, the circular waveguide 63B is constituted so as to function as a coaxial waveguide.

In addition, in the vacuum container 50, a stage 52 for carrying the wafer W is provided so that the stage 52 is disposed opposite to the top plate 54. The stage 52 contains a temperature control unit (not shown) disposed therein, so that the stage can function as a hot plate. Further, one end of an exhaust pipe 53 is connected to the bottom portion of the vacuum container 50, and the other end of the exhaust pipe 53 is connected to a vacuum pump 55.

One Embodiment of Plane Antenna Member

Figure 5:
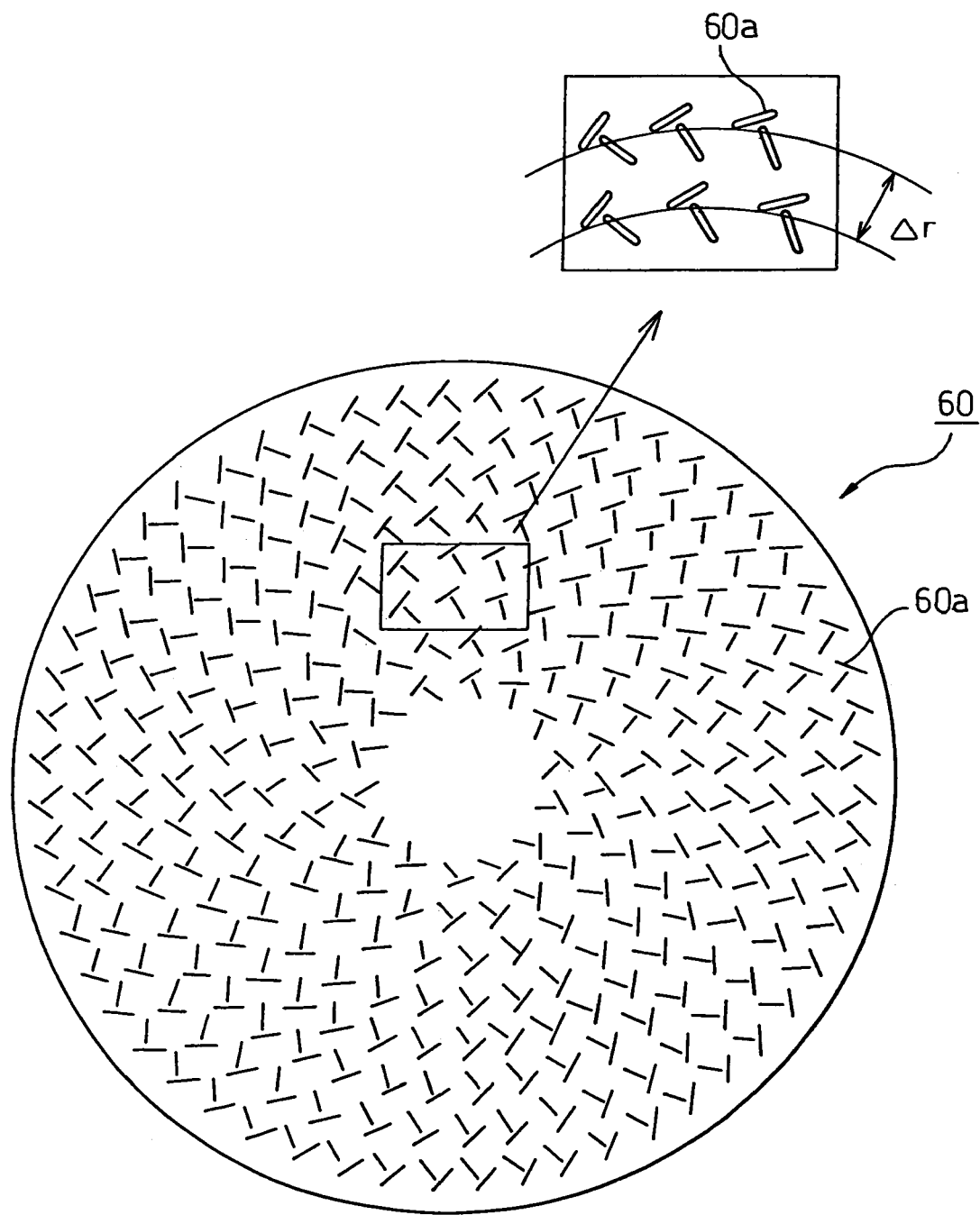
FIG. 5 is a schematic plan view showing an example of the plane antenna member which is usable in the oxide film-forming process according to the present invention.

FIG. 5 is a schematic plan view showing an example of plane antenna member 60 which is usable in an apparatus for producing an electronic device material according to the present invention.

As shown in this FIG. 5, on the surface of the plane antenna member 60, a plurality of slots 60a, 60a, . . . are provided in the form of concentric circles. Each slot 60a is a substantially square penetration-type groove. The adjacent slots are disposed perpendicularly to each other and arranged so as to form a shape of alphabetical "T"-type character. The length and the interval of the slot 60a arrangement are determined in accordance with the wavelength of the microwave supplied from the microwave power supply unit 61.

One Embodiment of Heating Reaction Furnace

Figure 6:
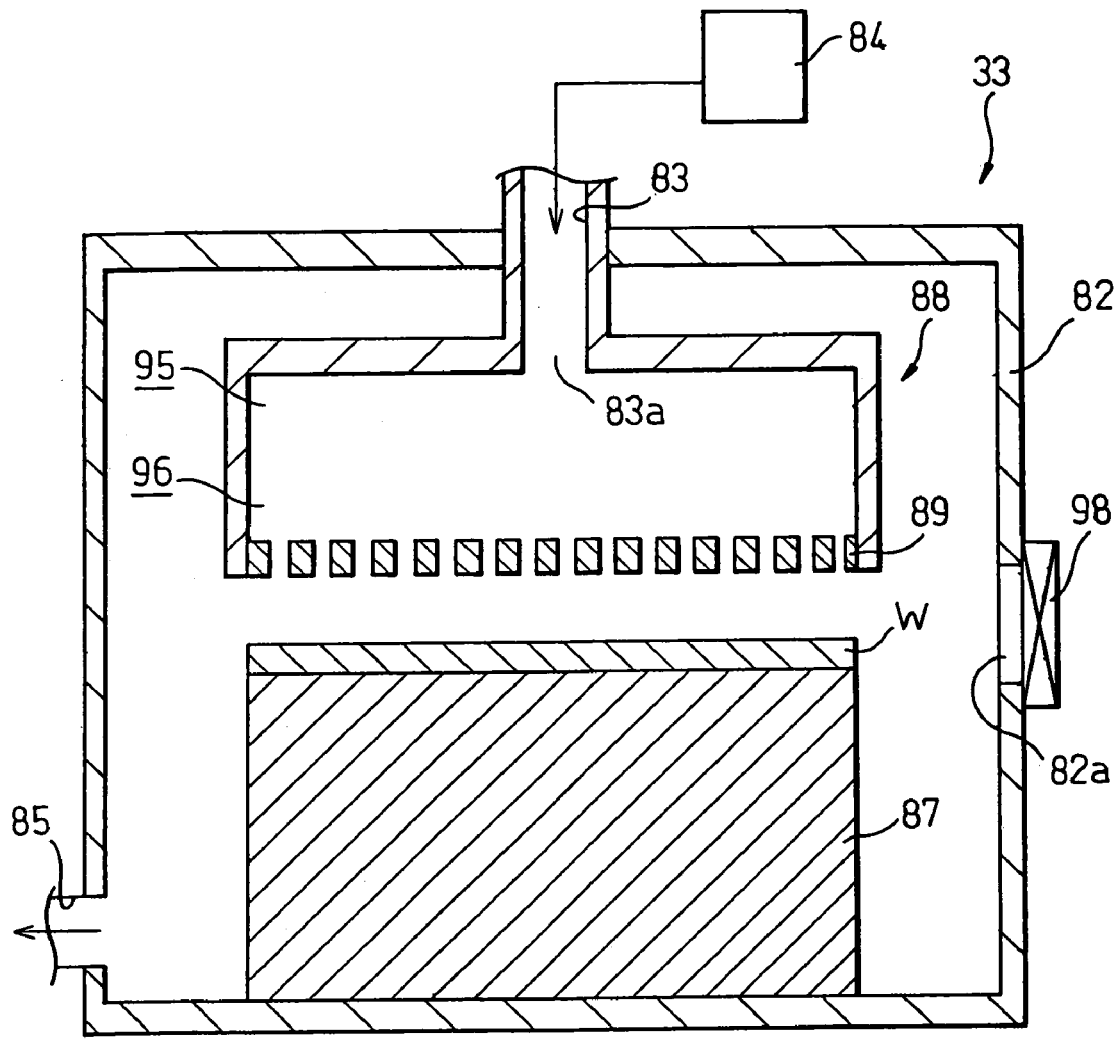
FIG. 6 is a schematic vertical sectional view of a plasma processing unit which is usable in the process for forming an electronic device according to the present invention.

FIG. 6 is schematic sectional view in the vertical direction showing an example of the heating reaction furnace 47 which is usable in an apparatus for producing an electronic device material according to the present invention.

As shown in FIG. 6, a processing chamber 82 of the heating reaction furnace 47 chamber is formed into an air-tight structure by using aluminum, for example. A heating mechanism and a cooling mechanism are provided in the processing chamber 82, although these mechanisms are not shown in FIG. 6.

As shown in FIG. 6, a gas introduction pipe 83 for introducing a gas into the processing chamber 82 is connected to the upper central portion of the processing chamber 82, the inside of the processing chamber 82 communicates with the inside of the gas introduction pipe 83. In addition, the gas introduction pipe 83 is connected to a gas supply source 84. A gas is supplied from the gas supply source 84 into the gas introduction pipe 83, and the gas is introduced into the processing chamber 82 through the gas introduction pipe 83. As the gas in this case, it is possible to use one of various gases such as raw material for forming a gate electrode (electrode-forming gas) such as silane, for example. As desired, it is also possible to use an inert gas as a carrier gas.

A gas exhaust pipe 85 for exhausting the gas in the processing chamber 82 is connected to the lower portion of the processing chamber 82, and the gas exhaust pipe 85 is connected to exhaust means (not shown) such as vacuum pump. On the basis of the exhaust means, the gas in the processing chamber 82 is exhausted through the gas exhaust pipe 85, and the processing chamber 82 is maintained at a desired pressure.

In addition, a stage 87 for carrying wafer W is provided in the lower portion of the processing chamber 82.

In the embodiment as shown in FIG. 6, the wafer W is carried on the stage 87 by means of an electrostatic chuck (not shown) having a diameter which is substantially the same as that of the wafer W. The stage 87 contains a heat source means (not shown) disposed therein, to thereby constitute a structure wherein the surface of the wafer W to be processed which is carried on the stage 87 can be adjusted to a desired temperature.

The stage 87 has a mechanism which is capable of rotating the wafer w which carried the stage 87, as desired.

In FIG. 6, an opening portion 82a for putting the wafer W in and out with respect to the processing chamber 82 is provided on the surface of the right side of the processing chamber 82 in this figure. The opening portion 82a can be opened and closed by moving a gate valve 98 vertically (up and down direction) in this figure. In FIG. 6, a transportation arm (not shown) for transporting the wafer is provided adjacent to the right side of the gate valve 98. In FIG. 6, the wafer W can be carried on the stage 87, and the wafer W after the processing thereof is transported from the processing chamber 82, as the transportation arm enters the processing chamber 82 and goes out therefrom through the medium of the opening portion 82a.

Above the stage 87, a shower head 88 as a shower member is provided. The shower head 88 is constituted so as to define the space between the stage 87 and the gas introduction pipe 83, and the shower head 88 is formed from aluminum, for example.

The shower head 88 is formed so that the gas exit 83a of the gas introduction pipe 83 is positioned at the upper central portion of the shower head 88. The gas is introduced into the processing chamber 82 through gas feeding holes 89 provided in the lower portion of the shower head 88.

Embodiment of Oxide Film Formation

Then, there is described a preferred embodiment wherein an oxide film is formed on a wafer W (e.g., a silicon substrate) by using the above-mentioned apparatus.

Referring to FIG. 1, at first, a gate valve (not shown) mounted on the sidewall of the process chamber 50 in the plasma processing unit 32 (FIG. 1) is opened to place the wafer W on the stage 52 (FIG. 1) by using transportation arms 37 and 38.

Then, the gate valve is closed to seal the inside thereof, and thereafter the temperature of the stage 52 is controlled to heat the wafer W to e.g., 400° C. At this time, for the purpose of a decrease in the heating time and of the uniformity, a rare gas such as Argon, a process gas at the time of forming an oxide film, from the gas supply tube 72 and water vapor are introduced at a flow rate of 500 sccm and 5 sccm, respectively, to increase the pressure up to 133 Pa, for example, to thereby increase the thermal conductivity between the stage and the wafer and to carry out the first step (preliminary heating).

After the first step is complete, a microwave of 2.45 GHz (3500 W), e.g., is generated from the microwave power source 61, and the microwave is guided through a microwave guide, and introduced through the plane antenna member 60 and the top plate 54 into the process chamber 50, to thereby generate plasma in the plasma region P in an upper portion of the process chamber 50.

Herein, the microwave is transmitted in the rectangular waveguide 63D in a rectangular mode, and is converted from the rectangular mode into a circular mode by the coaxial waveguide converter 63C. The microwave is then transmitted in the cylindrical coaxial waveguide 63B in the circular mode, and transmitted in the circular waveguide 63A in the expanded state, and is emitted from the slots 60$a$ of the plane antenna member 60, and penetrates the plate 54 and is introduced into the vacuum container 50. In this case, microwave is used, and accordingly high-density plasma can be generated. Further, the microwave is emitted from a large number of slots 60$a$ of the plane antenna member 60, and accordingly the plasma is caused to have a high plasma density.

One Embodiment of Water Vapor Supply

Figure 7:
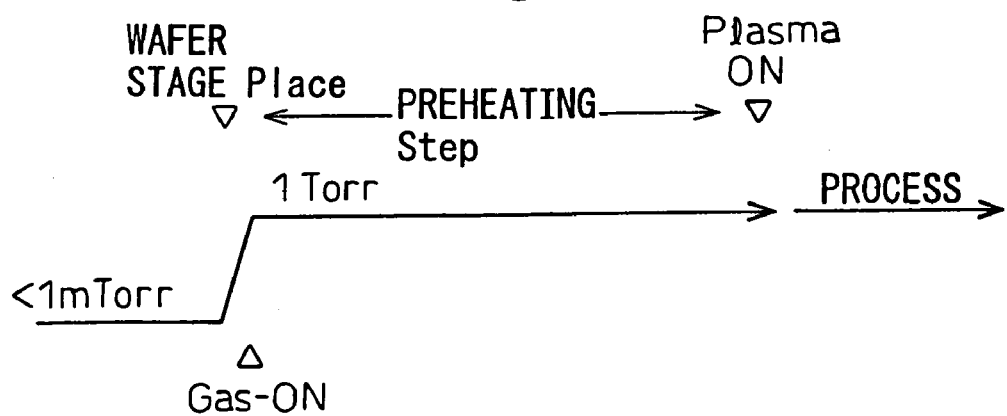
FIG. 7 is a graph showing an example of the steps of evacuation, preheating and plasma processing which is preferably usable in the oxide film-forming process according to the present invention.
Figure 8:
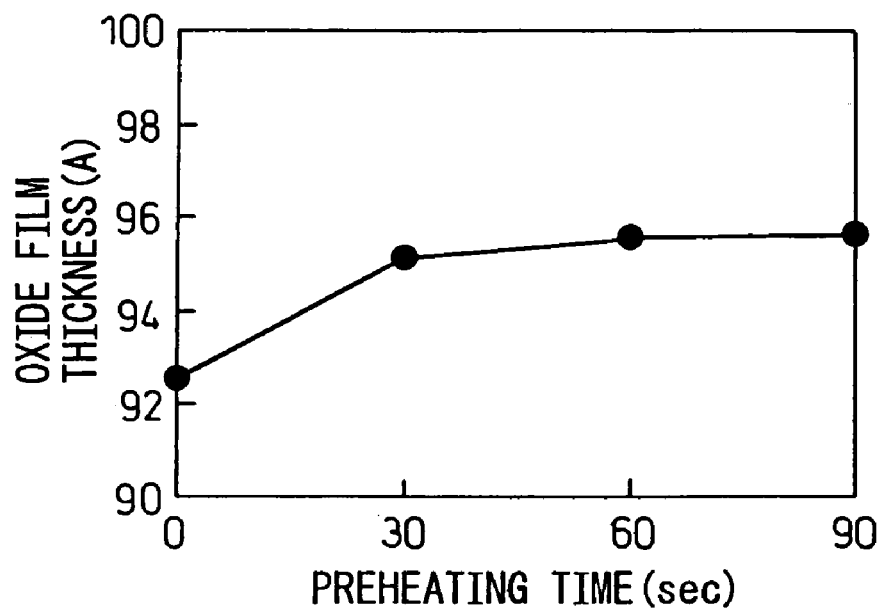
FIG. 8 is a graph showing the relationship between the thickness of an oxide film obtained by the oxide film-forming process according to the present invention and the process gas preheating time.
Figure 9:
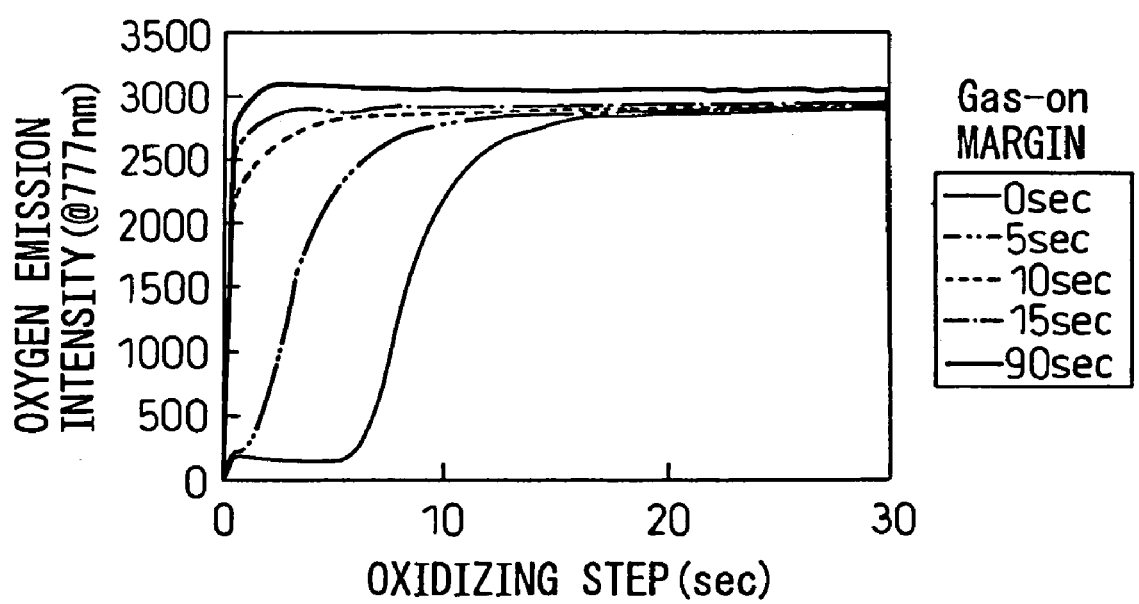
FIG. 9 is a graph showing an example of the relationship between the intensity of $O_2$ plasma emission obtained by the oxide film-forming process according to the present invention and the process gas preheating time.

Referring to FIGS. 7-9, one embodiment of the water vapor supply which is preferably be usable in the present invention is explained. This water vapor supply may preferably include: (1) a preliminary exhaust step, (2) a preliminary heating step, and (3) an oxidation step.

(Preliminary Exhaust Step)

Referring to FIG. 7, when a process gas containing at least water vapor is supplied to the process chamber 50, it is preferred to evacuate the process chamber 50 (about 133 mPa) prior to the supply in order to prevent the remaining or trace of the prior history. The evacuation time may differ with various factors, but in view of balance between the prevention of residual history and process efficiency, the evacuation time may preferably be about 0.5-1 min. In view of balance between the prevention of residual prior history and process efficiency, the evacuation may experimentally preferably be, e.g., 133 mPa and 0.5 to one minute.

(Preheating Step)

Then, an object to be processed (e.g., wafer W) is placed at the processing position in the process chamber 50, and then the supply of a process gas containing water vapor into the process chamber 50 is started. The pressure at this time may preferably be e.g., about 133 Pa.

The object to be processed is positioned and gas supply is started, and then the preheating step is started. At this time, in order to heat the object to be processed by using the thermal conductivity of the introduced gas, a higher pressure is preferred. In view of the simplicity of process flow and efficiency, however, the preheating step can also be carried out at the same condition as that of the oxidation condition. For example, the preheating of 400° C., 133 Pa and 1.5-2.0 minutes may experimentally be preferred.

(Oxidation Step)

After the above preheating step, plasma is ignited to start the processing of the object to be processed. The process gas flow and processing pressure have been adjusted by the above procedure, it is possible to transfer the procedure to the main step by only igniting the plasma.

(Relationship Between Preheating Time and Resultant Oxide Film Thickness)

One example of the dependence of the preheating time on the predetermined oxidation process is shown in FIG. 8.

When the preheating is insufficient, it is possible in some cases that the thickness of the resultant film is thin, the process reproducibility, for example, becomes problematic.

(Relationship Between Timing of Introducing Process Gas and Plasma Emission (Oxygenic Emission))

FIG. 9 shows an example of the relationship between the timing of introducing the process gas and the plasma emission. When a sufficient oxidizing gas atmosphere is not formed at the time of the plasma ignition, it is possible that the initial rise in the oxidation process step becomes unstable, and the process stability becomes problematic.

Another Embodiment of Water Vapor Supply

Figure 10:
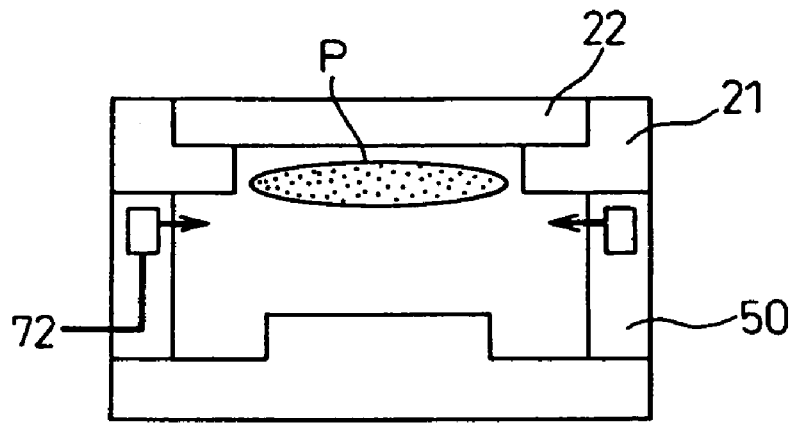
FIG. 10 is a schematic perspective view showing another example of the water vapor supply means which is preferably usable in the oxide film-forming process according to the present invention.

The schematic sectional view of FIG. 10 shows another embodiment of water vapor supply of the present invention. In this embodiment, water vapor are supplied from the position of the process chamber 50 which is "hidden" from the plasma (i.e. shadowed from the plasma). In general, in the vicinity of the gas inlet of the vacuum chamber, a difference in the gas concentration and in the pressure tends to occur due to the gas flow, and the plasma tends to be unstable. Unstable plasma may develop into abnormal discharge in some cases, and a localized abnormal discharge may hit the chamber component member with its strong electric field, so as to cause a contamination in the object to be processed. Accordingly, the embodiment in FIG. 10 is effective in attaining stable discharge of the plasma so as to prevent the contamination of the object to be processed.

Referring to FIG. 10, in such an embodiment, the upper portion of the process chamber 50 is composed of an aluminum upper plate 21 and a ceramic (e.g., alumina $Al_2O_3$) top plate 22 disposed on the upper plate 21. As shown in FIG. 10, the supply tube 72 for supplying water vapor (further, a rare gas as desired) is disposed at a position on the wall of the process chamber 50, which is "hidden" from the plasma (i.e. shadowed from the plasma).

Another Embodiment of Plasma Processing Apparatus

Figure 11:
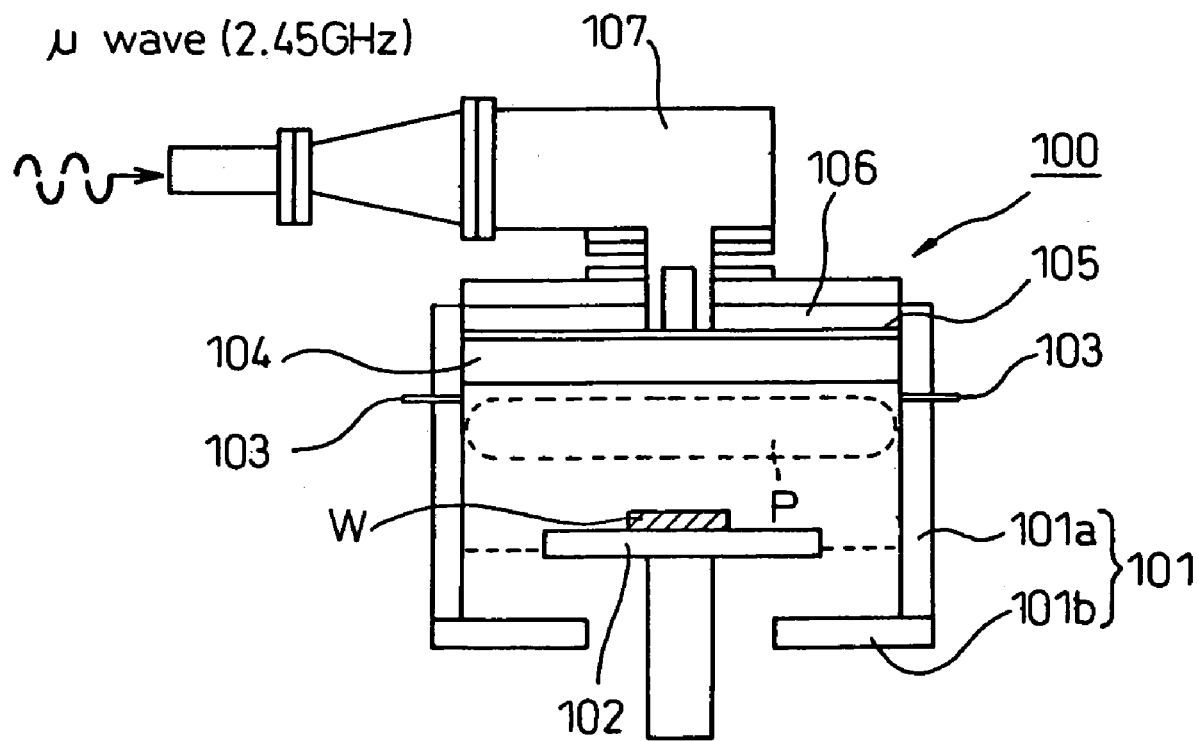
FIG. 11 is a schematic sectional view showing another example of the plasma processing apparatus according to the present invention.

FIG. 11 is a schematic sectional view showing another example of the plasma processing apparatus according to the present invention. Referring to FIG. 11, this embodiment is an example using a plane antenna member as an antenna member.

As shown in FIG. 11, this plasma processing apparatus 100 has a plasma process chamber 101 entirely shaped into a tubular form wherein a side wall 101$a$ and the bottom portion 101$b$ are composed of a conductor such as aluminum, and the interior of the plasma process chamber 101 is constructed as a sealed space.

In this plasma process chamber 101, there is housed, on the upper face thereof, a stage 102 for placing the object to be processed (e.g., semiconductor wafer W). This stage 102 is formed in an almost cylindrical shape which is composed of alumite-treated aluminum, etc., and provide a flat surface and a protruded portion.

On the upper surface of the above stage 102, there is provided an electrostatic chuck or clamp mechanism (not shown) for retaining thereon a wafer W. Further, this stage 102 is connected through a feeder line (not shown) to a matching box (not shown) and a high frequency power source (e.g., for 13.56 MHz; not shown) for supplying a bias. In the case of CVD, the high frequency power source 44 is omissible.

On the other hand, on the side wall of the above plasma process chamber 101, a gas supply nozzle 103 for introducing the above water vapor-containing gas into the container is provided as gas supply means.

The top portion of the plasma process chamber 101 is opened, to which an insulating plate 104 (having a thickness of, e.g., about 20 mm) which is composed of a ceramic material such as $Al_2O_3$ and has permeability to microwave is provided in an air-tight manner through a sealing member (not shown) such as O-ring.

On the top of this insulating plate 104 are provided a plane antenna member 105 in the form of a circular plate, and a slow wave material 106 (composed of quartz, $Al_2O_3$, AiN etc.) having a high dielectric characteristic. Microwave is transmitted to this plane antenna member 105 from a coaxial waveguide 107. The frequency of the microwave is not limited to 2.45 GHz, and other frequencies such as 8.35 GHz may be used.

Figure 12:
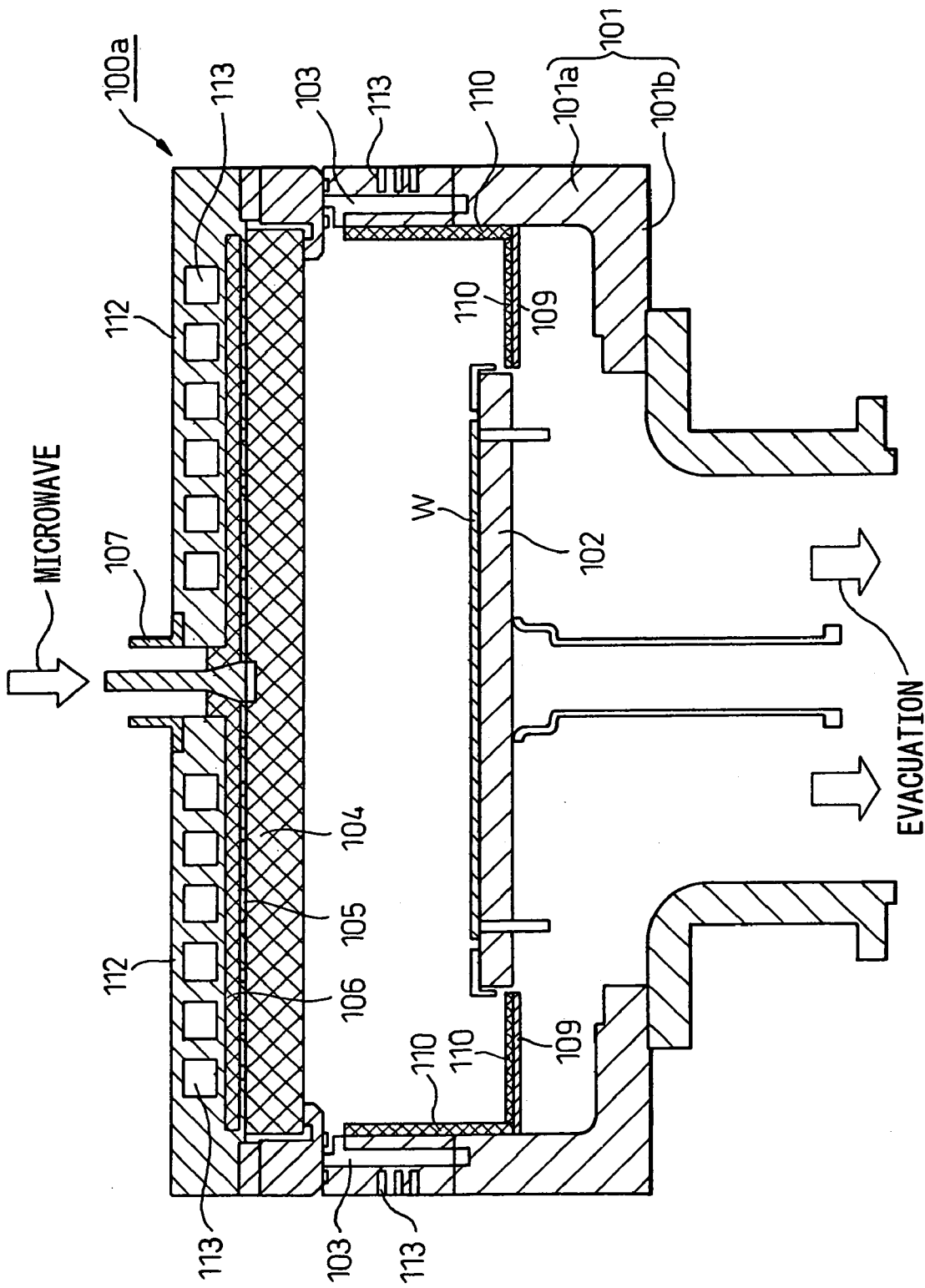
FIG. 12 is a schematic sectional view showing an example of the detailed structure of the plasma processing apparatus in FIG. 11.

FIG. 12 is a schematic sectional view showing an example of further details of the structure of FIG. 11. As shown in FIG. 12, the plasma processing apparatus 100a has a plasma process chamber 101 entirely shaped into a tubular form, of which side wall 101a and bottom portion 101b are composed of, e.g., a conductor such as aluminum, and the interior of the plasma process chamber 101 has been constructed as a sealed space.

In the plasma process chamber 101, there is housed, on top thereof, a stage 102 (stage) for placing an object to be processed (e.g., semiconductor wafer W) on the top thereof. The stage 102 has a heater (not shown) therein for heating the wafer W as desired.

On the other hand, on the side wall of the above plasma process chamber 101, a gas supply nozzle 103 for introducing the above water vapor-containing gas into the container is provided as gas supply means. In this FIG. 12, for rectification of the process gas, there is disposed a gas baffle plate 109 almost vertically to the side wall 101a at a height which is almost the same that of the stage, and further at the inside of the side wall 101a and the gas baffle plate 109, a liner (made of quartz) for preventing metal contamination is disposed.

To the opening of the top portion of the plasma process chamber 101, an insulating plate 104 (with a thickness of, e.g., about 20 mm) which is composed of a ceramic material such as Al2O3 and that has permeability to microwave is provided in an air-tight manner through a sealing member (not shown) such as an O-ring.

On the top of this insulating plate 104 are provided a discoid plane antenna member 105 and a slow wave material 106 (composed of quartz, $Al_2O_3$, AiN etc.) having a high dielectric characteristic. Due to the effect of shortening wavelength by the slow wave material 106 having the above high dielectric characteristic, the intratubal wavelength of microwave can be shortened.

In this FIG. 12, a cooling plate 112 is disposed on the slow wave material 106 in order to cool the slow wave material 106 etc., and at the inside of the cooling plate 112 and the inside of the side wall 101a, a coolant path 113 has been provided to cool these members.

To the above plane antenna member 105, as described above, a microwave (a frequency of 2.45 GHz etc.) is transmitted from the coaxial waveguide 107.

One Embodiment of Using Trench Groove

Figure 13:
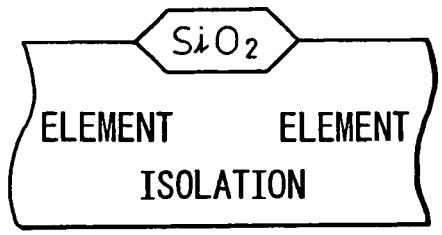
FIG. 13 is a schematic sectional view showing an example of the element isolation obtained by conventional LOCOS.

For the element isolation formed on an electronic device substrate, conventionally the so-called local oxidation of silicon (LOCOS) processing, which effects isolation by an oxide film locally formed on the substrate, has been mainly used (FIG. 13 shows a schematic sectional view of isolation of element obtained by LOCOS). However, this had a problem that when this LOCOS is used, a leak path tends to be formed, and thus the size of element isolation by LOCOS had to be small.

Figure 14:
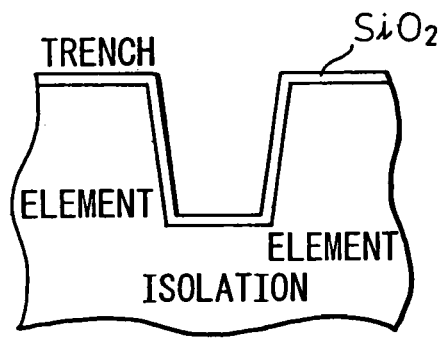
FIG. 14 is a schematic sectional view showing an example of element isolation by a trench groove obtained by STI.

Therefore, in recent years, the so-called shallow trench isolation (STI) that performs element isolation by forming trench groove in between elements and then forming an oxide film at the inside of the trench groove have come to be widely used (FIG. 14 shows a schematic sectional view of element isolation obtained by STI). When this STI technique is used, more secure element isolation can be attained as compared to the LOCOS mentioned above. On the other hand, however, when the conventional thermal oxidation process is used, it is difficult to form an oxide film having a uniform thickness on the surface of such trench groove, and thus in view of element isolation function, a plane orientation develops wherein an unnecessarily thick oxide film is formed, in order to obtain the minimum film thickness with respect to the plane orientation wherein growth rate is slow.

Difference in oxide film thickness generates stress, which may reduce the reliability of the film or may break it due to thermal stress imposed on in later steps. Also, an unnecessarily thick film hinders miniaturization. In contrast, In the present invention, a highly reliable oxide film which is uniform and independent of plane orientation can be formed.

Hereinbelow, the present invention will be described in more detail with reference to specific Examples.

EXAMPLES

The present invention will now be explained in more details with regard to Examples.

Example 1

(Oxide Film Formation)

An oxide film was formed on a silicon substrate by the oxide film-forming process according to the present invention. In the formation of this oxide film, a process chamber having a plane antenna member as shown in FIG. 1 and FIGS. 11-12 was used.

(Substrate)

As a silicon substrate, a monocrystalline silicon substrate (wafer) having a specific resistance of 8 (cm, a P type of a diameter of 200 mm and a plane orientation (100) was used.

(Prewashing)

The silicon substrate was washed in the following procedure.

1. Immerse in hyperammonium aqueous solution (10 minutes)
2. Rinse in pure water
3. Immerse in hyperhydrochloric acid aqueous solution (10 minutes)
4. Rinse in pure water
5. Immerse in hyperhydrofluoric acid aqueous solution (8 minutes)
6. Rinse in pure water
7. Dry in nitrogen gas (Plasma Oxidation Treatment)

Microwave output: 3500 W

Chamber pressure: 133 Pa

Substrate temperature: 400° C.

Noble gas flow rate: Ar=500 sccm

H2O flow rate: 5 sccm (Measurement of Processing Time and Oxide Film Thickness)

Figure 15:
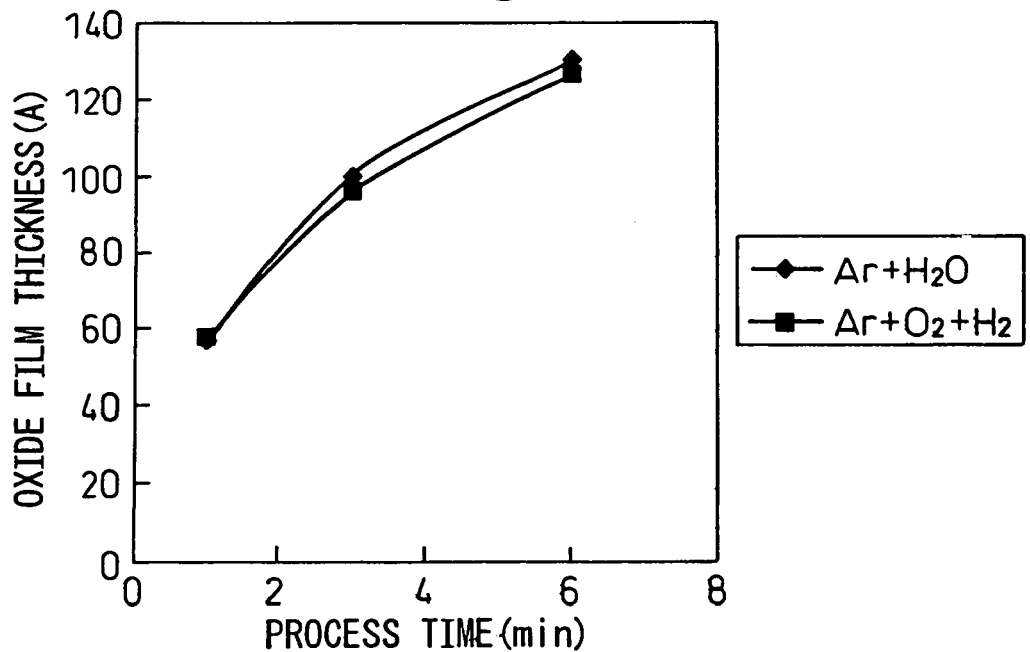
FIG. 15 is a graph showing an example of the relationship between the oxide film thickness in the present invention and the processing time.

The oxide film thickness was measured using an optical film thickness meter (ellipsometry). Relationship between the processing time and the oxide film thickness obtained is shown in the graph of FIG. 15.

Example 2

Measurement of Dependence on Crystal Orientation

Using a silicon substrate wherein trench groove had previously been processed, the same prewashing and plasma processing as Example 1 was carried out.

Figure 16:
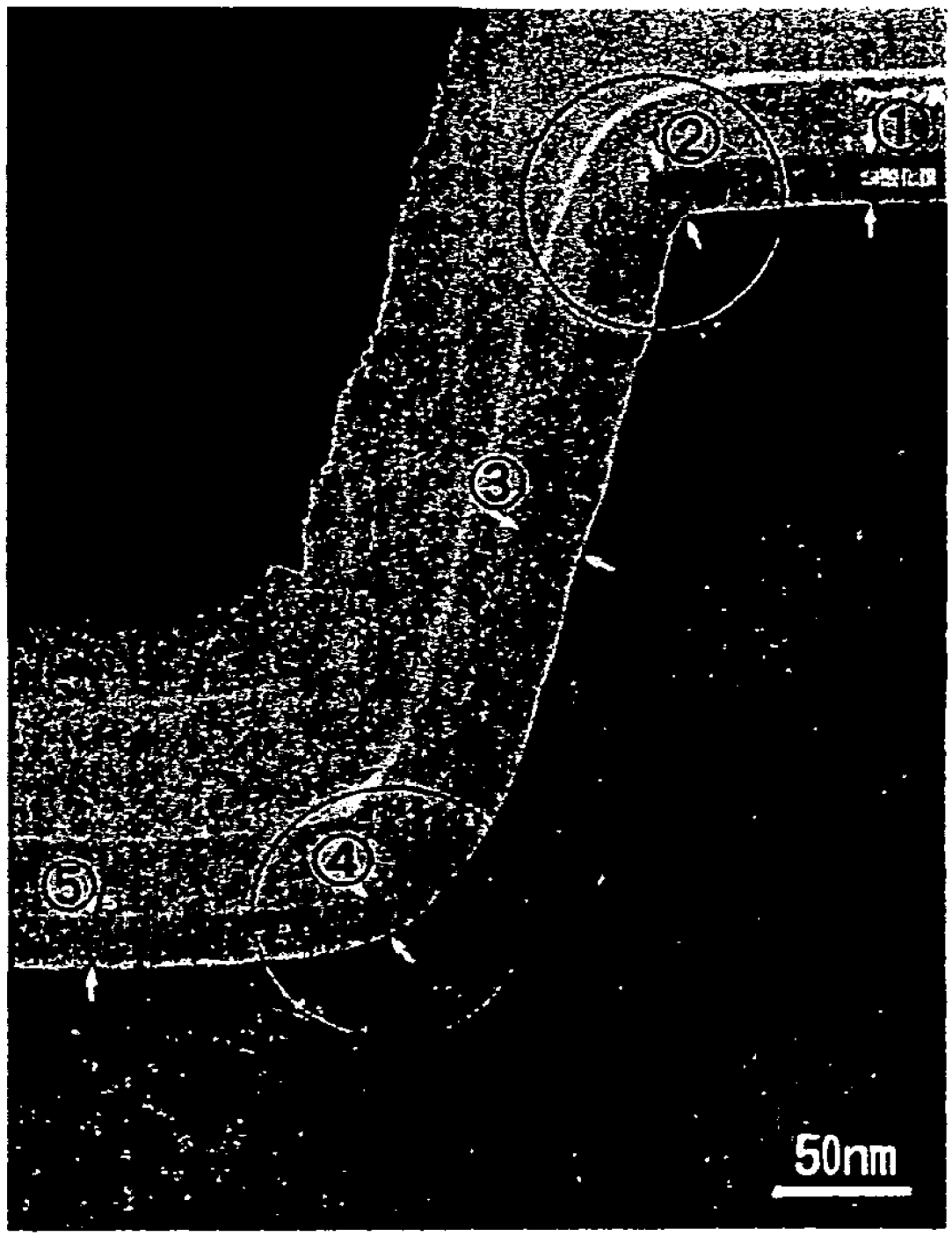
FIG. 16 is a TEM photograph showing the distribution of oxide film thickness in the vicinity of a trench groove obtained by the oxide film-forming process according to the present invention.

The dependence on crystal orientation of oxide film thickness was determined by the TEM observation of the cross section of the oxide film of trench groove. The result of measurement is shown in TEM photographs in the following (Table 1) and FIG. 16.

TABLE 1

| Position | Film thickness | Crystal orientation | Ratio of film thickness |
|---|---|---|---|
| 1 | 200 | 100 | 1.00 |
| 2 | 190 | | 1.05 |
| 3 | 230 | 110 | 0.87 |
| 4 | 170 | | 1.18 |
| 5 | 200 | 100 | 1.00 |

Comparative Example

The data obtained in the above measurement were compared to those obtained by the thermal oxidation process.

The data by the thermal oxidation process were cited from "Electronics Technical Directory (3) MOS Device" by Takashi Tokuyama.

Figure 17:
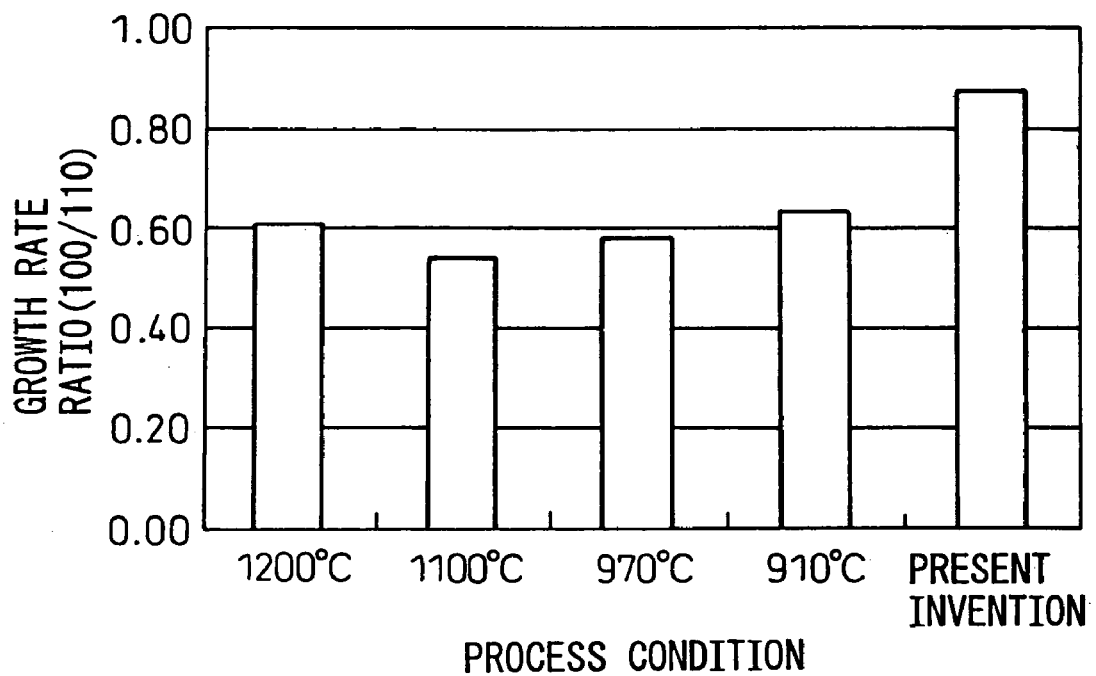
FIG. 17 is a graph showing the comparison of the crystal orientation dependency of an oxide film obtained by the oxide film-forming process according to the present invention with that by the conventional thermal oxidation process.

The comparison of the data obtained by the present invention and those of the Comparative Example are shown in the graph of FIG. 17.

Example 3

Confirmation of Quality of the Oxide Film

Figure 18:
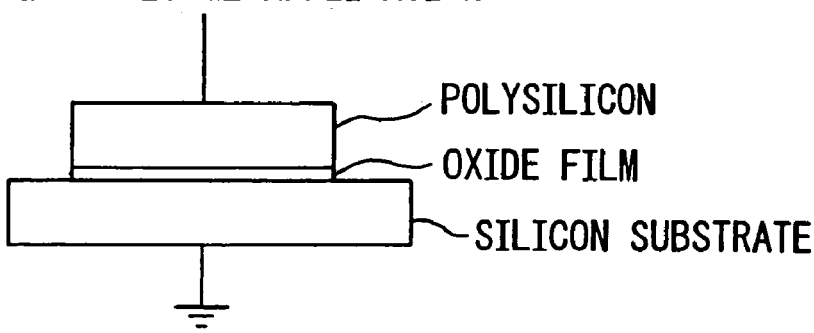
FIG. 18 is a schematic sectional view for explaining the process for evaluating the film quality used in Example 3.

As shown in the schematic sectional view of FIG. 18, polysilicon was deposited on the oxide film formed in Example 1 to prepare a sample for evaluating the quality of the oxide film.

Using the above sample, the electrical reliability of the oxide film was evaluated.

Figure 19:
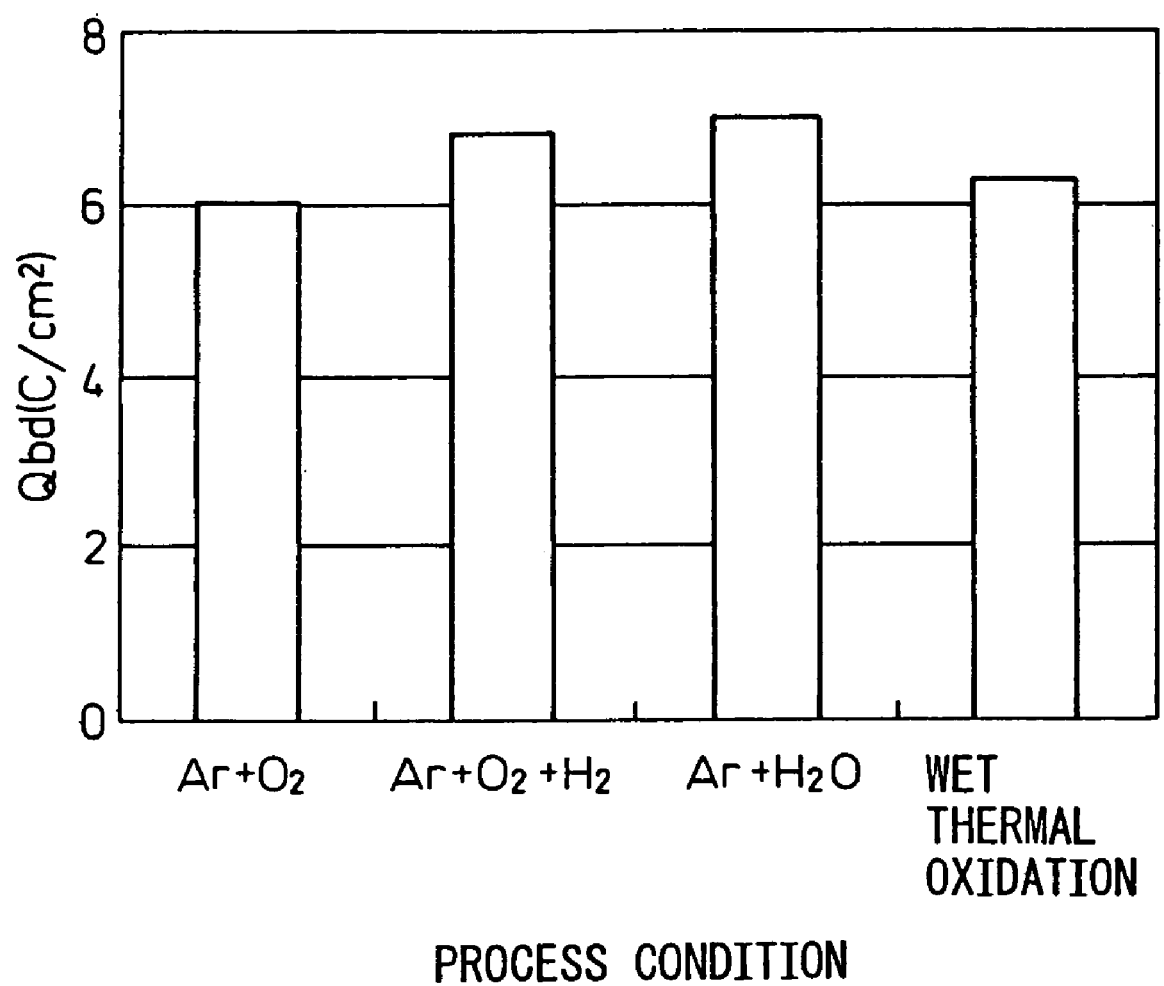
FIG. 19 is a graph showing the results of evaluation of the film quality obtained in Example 3.
Figure 21:
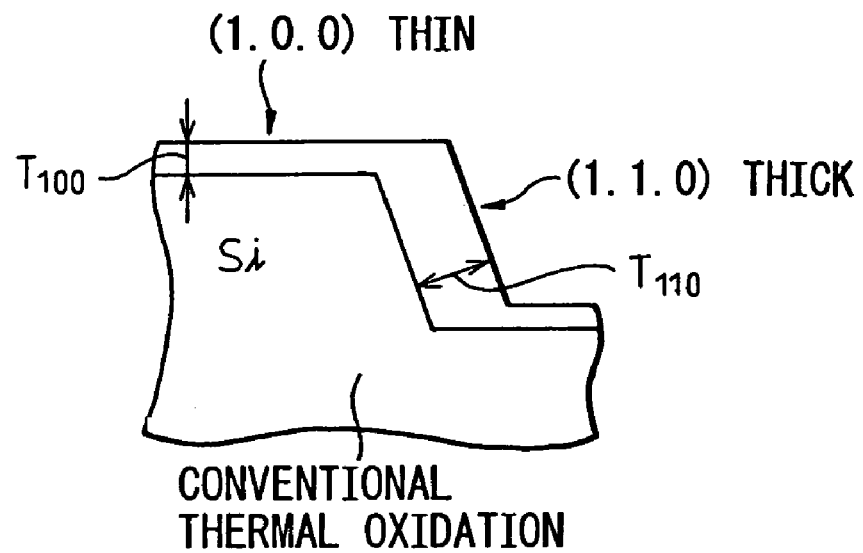
FIG. 21 is a schematic sectional view showing an example of the thickness of an oxide film on a trench groove obtained by the conventional thermal oxidation process.
Figure 22:
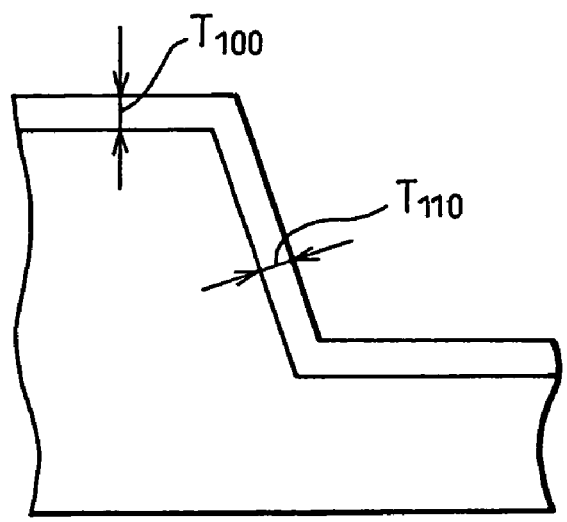
FIG. 22 is a schematic sectional view showing an example of the thickness of an oxide film on a trench groove obtained by plasma oxidation of the present invention.

In this evaluation, a voltage was applied on the polysilicon so that a constant current (0.1 A/cm$^2$) flows from the substrate to the polysilicon, and the time to the breakage of the oxide film was determined. Since the electric current till the breakage of the oxide film was constant, the scale for evaluation was represented by (electric current)×(time)=(electric amount: Qbd). The result of measurement is shown in the graph of FIG. 19. It can be evaluated that the greater the electric amount till the breakage of the oxide film, the more reliable the oxide film is.

(Test Condition)
Constant current stress: -0.1 A/cm2
Evaluation temperature: 120° C.
Evaluation size: 10000 μm2

As described above, the present invention provides an oxide film-forming process and an oxide film-forming apparatus which can form a high-quality oxide film, and also can easily control the film thickness of the oxide film. The present invention provides an electronic device material having such a high-quality oxide film.

In the present invention, an embodiment thereof wherein an oxide film is formed by using a low temperature (500° C. or lower) is particularly useful, when an electronic device substrate having a large diameter (e.g., 300 mm) is used. Conventionally, it was difficult to uniformly heat or cool such a large-diameter substrate, as compared with those having a smaller diameter (e.g., 200 mm)). Accordingly, when a low temperature processing is carried out according to the present invention, it is easy to minimize the occurrence of defects which may develop in the electronic device substrate (wafer) having a large diameter.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 146228/2003 filed on May 23, 2003 is hereby incorporated by reference.

What is claimed is:

1. A process for forming an oxide film onto a surface of a substrate, comprising:
    disposing the substrate in a chamber;
    introducing Ar gas and water vapor (H$_2$O) into the chamber;
    heating the substrate while increasing the pressure in the chamber;
    generating plasma based on the Ar gas and water vapor (H$_2$O) by using an antenna in the chamber; and
    oxidizing the surface of the substrate with the plasma based on the Ar gas and water vapor (H$_2$O), to thereby form an oxide film onto the surface of the substrate,
    wherein the water vapor (H$_2$O) is introduced in an amount of 0.2-2 volume % with respect to the Ar gas.

2. An oxide film-forming process according to claim 1, wherein the oxide film is formed at a temperature of 500° C. or lower.

3. An oxide film-forming process according to claim 1, wherein the plasma is generated on the basis of microwave irradiation through a plane antenna member having a plurality of slits.

4. An oxide film-forming process according to claim 1, wherein the plasma has an electron temperature of 1.5 eV or less.

5. An oxide film-forming process according to claim 1, wherein the electronic device substrate is heated for a period of 30 seconds or more.

6. An oxide film-forming process according to claim 1, wherein the electronic device substrate is washed before the plasma processing thereof.

7. An oxide film-forming process according to claim 1, wherein the pressure of the water vapor is 6.67-266 Pa.

* * * * *

UNITED STATES PATENT AND TRADEMARK OFFICE
CERTIFICATE OF CORRECTION

PATENT NO. : 7,632,758 B2 Page 1 of 1
APPLICATION NO. : 11/508871
DATED : December 15, 2009
INVENTOR(S) : Kitagawa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 242 days.

Signed and Sealed this

Twenty-first Day of December, 2010

David J. Kappos
*Director of the United States Patent and Trademark Office*